(12) United States Patent
Kim

(10) Patent No.: US 11,367,741 B2
(45) Date of Patent: Jun. 21, 2022

(54) ARRAY SUBSTRATE, MANUFACTURING METHOD THEREOF, DISPLAY PANEL, AND ELECTRONIC DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventor: Young Min Kim, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 537 days.

(21) Appl. No.: 16/339,157

(22) PCT Filed: Nov. 15, 2018

(86) PCT No.: PCT/CN2018/115655
§ 371 (c)(1),
(2) Date: Apr. 3, 2019

(87) PCT Pub. No.: WO2019/179137
PCT Pub. Date: Sep. 26, 2019

(65) Prior Publication Data
US 2021/0327925 A1    Oct. 21, 2021

(30) Foreign Application Priority Data
Mar. 22, 2018  (CN) .......................... 201810240944.4

(51) Int. Cl.
*H01L 29/66* (2006.01)
*H01L 27/12* (2006.01)
*H01L 27/32* (2006.01)

(52) U.S. Cl.
CPC ...... *H01L 27/1255* (2013.01); *H01L 27/1259* (2013.01); *H01L 27/3265* (2013.01)

(58) Field of Classification Search
CPC ............. H01L 27/1255; H01L 27/1259; H01L 27/3265
(Continued)

(56) References Cited

U.S. PATENT DOCUMENTS 9,006,717 B2    4/2015  Kim et al.
9,039,477 B2 *  5/2015  Kim ................... H01L 27/3253
                                                     445/25
10,319,742 B2   6/2019  Jiang et al.

FOREIGN PATENT DOCUMENTS

CN    102623451 A  *  8/2012
CN    102623451 A     8/2012
(Continued)

OTHER PUBLICATIONS

International Search Report and Written Opinion dated Dec. 28, 2018; PCT/CN2018/115655.

*Primary Examiner* — Tan N Tran

(57) ABSTRACT

An array substrate, a manufacturing method thereof, a display panel and an electronic device are disclosed. The array substrate includes: a base substrate, a first electrode and a second electrode. The first electrode is disposed on the base substrate; the second electrode is disposed on the first electrode and is at least partly opposite to the first electrode in a direction perpendicular to the base substrate; the first electrode and the second electrode are electrically insulated from each other; a capacitor structure is constituted by a region of the first electrode and a region of the second electrode which are opposite to each other; and the capacitor structure includes a portion which forms at least part of a first recess.

20 Claims, 5 Drawing Sheets

(58) Field of Classification Search
USPC .................................... 257/59, 72, 432, 330
See application file for complete search history.

(56) References Cited

FOREIGN PATENT DOCUMENTS

| | | |
|---|---|---|
| CN | 104576682 A | 4/2015 |
| CN | 106647059 A | 5/2017 |
| CN | 108447874 A | 8/2018 |

\* cited by examiner

ABSTRACT

ARRAY SUBSTRATE, MANUFACTURING METHOD THEREOF, DISPLAY PANEL, AND ELECTRONIC DEVICE

CROSS-REFERENCE TO RELATED APPLICATIONS

The present application claims priority to Chinese patent application No. 201810240944.4 filed on Mar. 22, 2018 under the title of "ARRAY SUBSTRATE AND MANUFACTURING METHOD THEREOF, DISPLAY PANEL AND ELECTRONIC DEVICE", the entire disclosure of the above-mentioned Chinese patent application is incorporated herein by reference as part of embodiments of the present disclosure.

TECHNICAL FIELD

Embodiments of the present disclosure relate to an array substrate, a manufacturing method thereof, a display panel and an electronic device.

BACKGROUND

Liquid crystal display panel, organic light-emitting diode display panel and the like have been widely applied in various display devices for characteristics of thinner and lighter design, good shock-resistant property, wide viewing angle, high contrast ratio and the like. For example, a display panel usually includes a plurality of sub-pixels arranged in an array, and each of the sub-pixels, for example, includes structures such as thin film transistor (TFT) and capacitor. For example, with the development of display technologies and customers' demands on display quality of the display panel, a resolution ratio of the display panel is continually improved. Correspondingly, an area occupied by each of the sub-pixels is increasingly smaller, which results in higher requirements in terms of a design of capacitor structure and the like in the display panel.

SUMMARY

At least one embodiment of the present disclosure provides an array substrate, including:
a base substrate;
a first electrode on the base substrate; and
a second electrode at a side of the first electrode facing away from the base substrate, the second electrode being at least partly opposite to the first electrode in a direction perpendicular to the base substrate, wherein
the first electrode and the second electrode are electrically insulated from each other, and a capacitor structure is constituted by a region of the first electrode and a region of the second electrode which are opposite to each other; the capacitor structure includes a portion forming at least part of a first recess.

In one or more embodiments of the present disclosure, the capacitor structure includes a portion forming a plurality of first recesses.

In one or more embodiments of the present disclosure, the array substrate further includes an insulating layer; the insulating layer is located between the base substrate and the first electrode and includes a second recess formed in the insulating layer; the capacitor structure is at least located on a side wall of the second recess.

In one or more embodiments of the present disclosure, the portion of the capacitor structure forming at least part of the first recess is at least partly overlapped with the second recess in the insulating layer, in the direction perpendicular to the base substrate.

In one or more embodiments of the present disclosure, the insulating layer has a stacked structure and includes at least two insulating sub-layers which are stacked sequentially from the base substrate; the second recess penetrates at least one insulating sub-layer at a side of the insulating layer far away from the base substrate.

In one or more embodiments of the present disclosure, at least part of an insulating sub-layer at a side of the insulating layer closest to the base substrate is not penetrated by the second recess.

In one or more embodiments of the present disclosure, the insulating layer includes a plurality of second recesses, the capacitor structure includes a portion forming a plurality of first recesses, the plurality of first recesses and the plurality of second recesses are in one-to-one correspondence, and each of the plurality of first recesses is located inside one of the plurality of second recesses.

In one or more embodiments of the present disclosure, the capacitor structure further includes a dielectric layer located between the first electrode and the second electrode, so that the first electrode and the second electrode are electrically insulated from each other.

In one or more embodiments of the present disclosure, the array substrate further includes a thin film transistor (TFT), the TFT includes an active layer, a gate electrode and a source-drain electrode; the first electrode is located in a same layer with any one of the active layer, the gate electrode and the source-drain electrode; and the second electrode is located in a same layer with one of the other two of the active layer, the gate electrode and the source-drain electrode.

In one or more embodiments of the present disclosure, the array substrate further includes a TFT and a light-emitting element; the TFT includes a drain electrode, the light-emitting element includes a pixel electrode, and the pixel electrode is electrically connected with the drain electrode.

At least one embodiment of the present disclosure further provides a display panel including any array substrate described above.

At least one embodiment of the present disclosure further provides an electronic device including any array substrate described above.

At least one embodiment of the present disclosure further provides a manufacturing method of an array substrate, including:
providing a base substrate;
forming a first electrode on the base substrate;
forming a second electrode on the first electrode, the second electrode being at least partly opposite to the first electrode in a direction perpendicular to the base substrate, wherein
the first electrode and the second electrode are electrically insulated from each other, and a capacitor structure is constituted by a region of the first electrode and a region of the second electrode which are opposite to each other; the capacitor structure includes a portion forming at least part of a first recess.

In one or more embodiments of the present disclosure, the capacitor structure includes a portion forming a plurality of first recesses.

In one or more embodiments of the present disclosure, the manufacturing method further includes:

before forming the first electrode, forming an insulating layer film on the base substrate and etching the insulating layer film to form an insulating layer including a second recess, wherein the portion of the capacitor structure forming at least part of the first recess is at least partly overlapped with the second recess in the direction perpendicular to the base substrate.

In one or more embodiments of the present disclosure, the capacitor structure is at least formed on a side wall of the second recess.

In one or more embodiments of the present disclosure, the manufacturing method further includes:

forming a gate electrode of a thin film transistor (TFT) in a first patterning process of forming the first electrode; and forming a source electrode and a drain electrode of the TFT in a second patterning process of forming the second electrode.

At least one embodiment of the present disclosure further provides an array substrate, including:

a base substrate;

an insulating layer located on the base substrate, the insulating layer including a recess, the recess penetrating at least part of the insulating layer from a side of the insulating layer facing away from the base substrate; and a capacitor structure at least located on a side wall of the recess, the capacitor structure including a first electrode, a second electrode and a dielectric layer located between the first electrode and the second electrode.

In one or more embodiments of the present disclosure, the capacitor structure is also located on a bottom wall of the recess.

At least one embodiment of the present disclosure further provides a manufacturing method of an array substrate, including:

forming an insulating layer on a base substrate;

forming a recess in the insulating layer, the recess penetrating at least part of the insulating layer from a side of the insulating layer facing away from the base substrate; and forming a capacitor structure at least on a side wall of the recess in a conformal manner, forming the capacitor structure including: forming a first electrode, forming a second electrode and forming a dielectric layer located between the first electrode and the second electrode.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objects, technical details and advantages of the embodiments of the present disclosure apparent, technical solutions according to the embodiments of the present disclosure will be described clearly and completely as below in conjunction with the accompanying drawings of embodiments of the present disclosure. Apparently, the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, the technical terminology or scientific terminology used herein should have the same meaning as commonly understood by one of ordinary skill in the art to which this disclosure belongs. Likewise, terms like "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" or the like is only used to describe a relative positional relationship, and when the absolute position of a described object is changed, the relative positional relationship might also be changed accordingly.

With the development of display technologies and the demands on development of society, in order to improve a display quality of a display panel, the display panel has been continuously developed in terms of resolution ratio. The higher the resolution ratio of the display panel is, the smaller the area occupied by each of the sub-pixels in the display panel will be. Correspondingly, an area occupied by a capacitor structure in each of the sub-pixels is increasingly smaller, and a capacitance of the capacitor structure would also be reduced. As a result, ensuring the capacitance of the capacitor structure while improving the resolution ratio of the display panel has become one of research subjects in the field of display.

Figure 1:
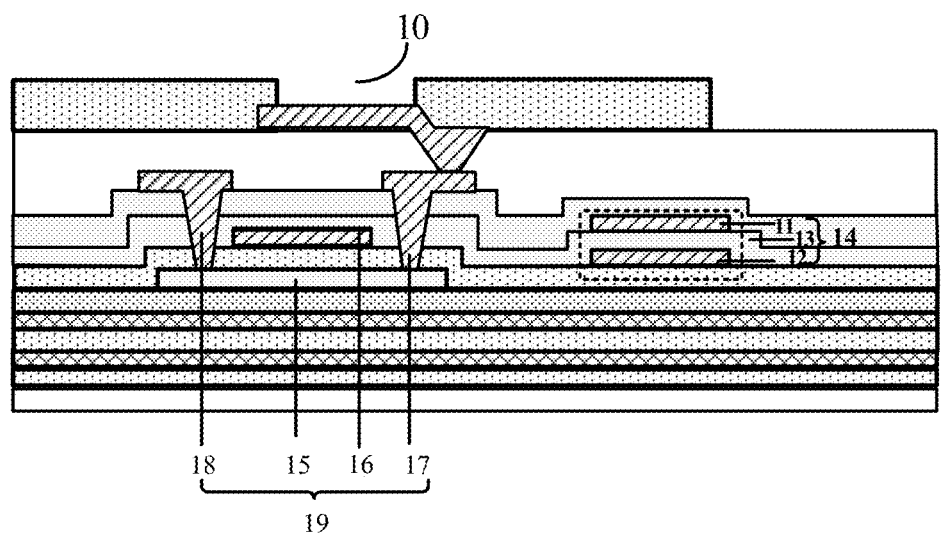
FIG. 1 is a schematic diagram illustrating a sectional structure of an array substrate.

For example, FIG. 1 is a schematic diagram illustrating a sectional structure of an array substrate 10. As illustrated in FIG. 1, the array substrate 10 includes a thin film transistor (TFT) 19, a capacitor structure 14 and other structures. For example, the TFT 19 includes an active layer 15, a gate electrode 16, a source electrode 17, a drain electrode 18 and other structures. The capacitor structure 14 includes a first electrode 11, a second electrode 12, a dielectric layer 13 located between the first electrode 11 and the second electrode 12, and other structures. As illustrated in FIG. 1, the first electrode 11 and the second electrode 12 of the capacitor structure 14 both are flat plate-shaped structures. When each of sub-pixels of the array substrate 10 occupies a relatively smaller area, an area occupied by the capacitor structure 14 in each of the sub-pixels is also small. Therefore, an area of regions of the first electrode 11 and the second electrode 12 opposite to each other is correspondingly small, which may result in that the capacitance of the capacitor structure 14 is too small to meet the demands of product design.

The capacitance may be expressed as $C=K\times(A/d)$, wherein C denotes a capacitance, K denotes a dielectric constant of the dielectric layer, A denotes an area of portions of the two electrodes in the capacitor structure opposite to each other, and d denotes a vertical distance between the two electrodes in the capacitor structure. For example, d usually is a thickness of the dielectric layer, or d is a size of the dielectric layer in a direction perpendicular to the first electrode and/or the second electrode. As it also can be seen from the formula, the capacitance is in direct proportion to the area of the portions of the two electrodes which are right opposite to each other.

In order to improve the resolution ratio of the display panel without reducing the capacitance of the capacitor structure, on one aspect, it can, for example, utilize a dielectric layer material having a great dielectric constant K. For example, the dielectric layer material having a great dielectric constant K includes $ZrO_2$, $HfO_2$ or the like. But it usually needs to perform a thin film deposition with the dielectric layer material having a great dielectric constant K under high temperature condition or by using atomic layer deposition (ALD) method. However, the existing manufacturing method of low temperature polysilicon (LTPS) display panel or organic light-emitting diode (OLED) display panel and the like cannot satisfy the high temperature condition required by the deposition of a dielectric film having a great dielectric constant K, and cannot meet the requirements on practical production efficiency because of a poor deposition rate of the ALD method.

On the other aspect, for example, it can increase the capacitance C of the capacitor structure by reducing the thickness d of the dielectric layer. However, in a practical manufacturing process, the dielectric layer in the capacitor structure, for example, can also be used as a gate insulating layer of the TFT in the display panel at the same time, and the decrease of the thickness d of the dielectric layer may result in a driving issue brought by a tunnel effect due to a leakage current generated by the TFT, or may result in a poor image brought by a flicker issue, thereby affecting the display effect of the display panel.

At least one embodiment of the present disclosure provides an array substrate, including: a base substrate, a first electrode and a second electrode. The first electrode is disposed on the base substrate; the second electrode is disposed on the first electrode and is at least partly opposite to the first electrode in a direction perpendicular to the base substrate. The first electrode and the second electrode are electrically insulated from each other; and at least one of the first electrode and the second electrode has a portion forming at least part of a first recess in regions of the first electrode and the second electrode opposite to each other.

At least one embodiment of the present disclosure provides an array substrate, including: a base substrate, an insulating layer and a capacitor structure. The insulating layer is located on the base substrate and includes a recess. The recess penetrates at least part of the insulating layer from a side of the insulating layer facing away from the base substrate. The capacitor structure is at least located on a side wall of the recess; and the capacitor structure includes a first electrode, a second electrode and a dielectric layer located between the first electrode and the second electrode.

For example, in the embodiment of the present disclosure, the first recess is formed by a portion of the first electrode, a portion of the second electrode and/or a portion of the capacitor structure, and is formed by forming a bending portion in the first electrode, the second electrode and/or the capacitor structure. For example, in the embodiment of the present disclosure, at least one of the first electrode, the second electrode and the capacitor structure has substantially the same size everywhere, i.e., having uniform thickness.

In the array substrate provided by at least one embodiment of the present disclosure, by forming at least part of a first recess in a region of the first electrode and/or a region of the second electrode opposite to each other, it can increase a relative area of the first electrode and the second electrode in regions opposite to each other, so as to increase a capacitance of the capacitor structure constituted by the first electrode and the second electrode.

Hereinafter, the present disclosure will be described with reference to several concrete embodiments. In order to make the following description of the embodiments of the present disclosure simple and clear, well-known function(s) and component(s) may be omitted with detailed explanation thereof. When any component of the embodiments of the present disclosure is appeared in more than one figure, it may be denoted by using the same reference sign in each figure.

Figure 2:
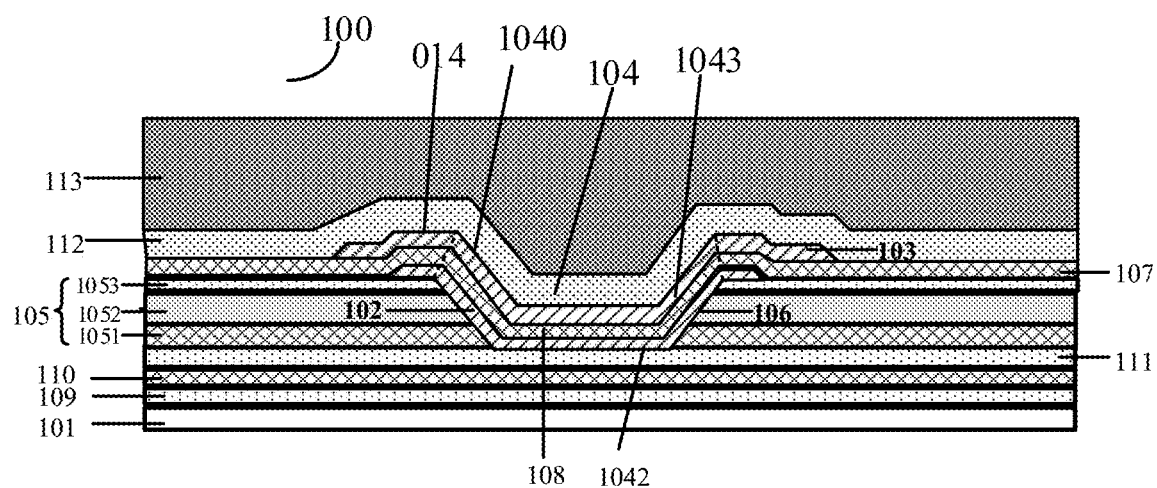
FIG. 2 is a schematic diagram illustrating a sectional structure of an array substrate provided by an embodiment of the present disclosure.

FIG. 2 is a schematic diagram illustrating a sectional structure of an array substrate 100 provided by an embodiment of the present disclosure. FIG. 2 emphasizes on illustrating the capacitor structure of the array substrate provided by the embodiment of the present disclosure. The capacitor structure illustrated in FIG. 2 can be used to replace the capacitor structure illustrated in FIG. 1 so as to increase the capacitance. For example, the array substrate 100 may be an array substrate of a display panel of any appropriate type, and the type of the display panel including the array substrate is not particularly limited in the present embodiment. As illustrated in FIG. 2, the array substrate 100 includes a base substrate 101, a first electrode 102, a second electrode 103 and other structures.

As illustrated in FIG. 2, the base substrate 101, for example, may be a glass substrate, a quartz substrate, a plastic substrate or a substrate of other suitable materials, without particularly limited in the present embodiment. For example, the base substrate 101 may be a flexible substrate, and may also be a rigid substrate.

As illustrated in FIG. 2, the first electrode 102 is disposed on the base substrate 101. The second electrode 103 is disposed on the first electrode 102 and is at least partly opposite to the first electrode 102 in a direction perpendicular to the base substrate 101. The first electrode 102 and the second electrode 103 are electrically insulated from each other, and regions of the first electrode 102 and the second electrode 103 that are opposite to each other include a portion forming a first recess 104. For example, the number of the first recess 104 formed by the first electrode 102 and/or the second electrode 103 may be one and may also be plural, without particularly limited in the present embodiment. Additionally, the first recess 104 formed by the first electrode 102 and/or the second electrode 103 for example may be in a shape of an integral recess, and can also be at least part of a recess. For example, at least one of the region of the first electrode 102 and the region of the second electrode 103 opposite to each other forms a side wall of the recess. The shape of the first recess 104 formed by the first electrode 102 and/or the second electrode 103 is not particularly limited in the present embodiment. The embodiment will be described with reference to the case where each of the first electrode 102 and the second electrode 103 includes one first recess 104, by way of example.

For example, the first recess 104 is formed by forming a portion of the first electrode 102 into a bending structure. For example, the first recess 104 is formed by forming a portion of the second electrode 103 into a bending structure. For example, as illustrated in FIG. 2, a region of the first electrode 102 opposite to the second electrode 103 includes a portion 1042 forming a first recess 104. For example, as illustrated in FIG. 2, a region of the second electrode 103 opposite to the first electrode 102 includes a portion 1043 forming a first recess 104. For example, as illustrated in FIG. 2, the region of the first electrode 102 and the region of the second electrode 103 that are opposite to each other constitute a capacitor structure 014, and the capacitor structure 014 includes a portion 1040 forming at least part of a first recess 104. For example, an example of a material of the first electrode 102 and the second electrode 103 includes a metallic material, and the metallic material for example includes Ag, Al, Cr, Cu, Mo, Ti, Al—Nd alloy, Cu—Mo alloy, Mo—Ta alloy, Mo—Nd alloy or any combination thereof, without particularly limited in the present embodiment.

For example, as illustrated in FIG. 2, the array substrate 100 further includes an insulating layer 105; the insulating layer 105 is disposed on the base substrate 101 and is located between the base substrate 101 and the first electrode 102. The insulating layer 105 for example includes a second recess 106 formed therein. As illustrated in FIG. 2, the first recess 104 of the first electrode 102 is at least partly overlapped with the second recess 106 in the insulating layer 105 in the direction perpendicular to the base substrate 101. As illustrated in FIG. 2, a bottom wall and a side wall of the second recess 106 each are formed with the first electrode 102 and the second electrode 103 in a conformal manner. In an example, when the first electrode 102 includes a portion forming a first recess 104, the portion of the first electrode 102 forming the first recess 104 is at least partly overlapped with the second recess 106 in the insulating layer 105 in the direction perpendicular to the base substrate 101. For example, the portion of the first electrode 102 or the second electrode 103 forming the first recess 104 is at least overlapped with the side wall of the second recess 106 in the insulating layer 105 in the direction perpendicular to the base substrate 101.

For example, as illustrated in FIG. 2, the insulating layer 105 has a stacked structure, and includes a first insulating sub-layer 1051, a second insulating sub-layer 1052 and a third insulating sub-layer 1053 which are stacked sequentially from the base substrate 101. The second recess 106 in the insulating layer 105 penetrates at least one insulating sub-layer at a side of the insulating layer 105 far away from the base substrate 101. For example, a recess may be formed in the third insulating sub-layer 1053 of the insulating layer 105 so as to constitute the second recess 106; or, a recess may be formed in the third insulating sub-layer 1053 and the second insulating sub-layer 1052 of the insulating layer 105 so as to constitute the second recess 106; or, a recess may be formed in the third insulating sub-layer 1053, the second insulating sub-layer 1052 and the first insulating sub-layer 1051 of the insulating layer 105 so as to constitute the second recess 106. The number of the insulating sub-layer in the insulating layer 105 penetrated by the second recess 106 is not particularly limited in the present embodiment. It should be noted that, the number of the insulating sub-layer included in the insulating layer 105 includes but is not limited to three. For example, depending on the demands of product design, the number of the insulating sub-layer included in the insulating layer 105 may be one, two, four or more, without particularly limited in the present embodiment. In the embodiment of the present disclosure, the second recess 106 may also penetrate a part of the insulating sub-layer. For example, in order to facilitate the manufacture of the array substrate and a stable performance, a portion of the insulating sub-layer at a side of the insulating layer 105 closest to the base substrate 101 is not penetrated by the second recess 106. For example, a thickness of the portion of the insulating sub-layer at the side of the insulating layer 105 closest to the base substrate 101 being not etched is about ⅙-⅓ of a thickness of this insulating sub-layer. For example, the thickness of the insulating sub-layer at the side of the insulating layer 105 closest to the base substrate 101 is about 6000 Å, and the thickness of the portion of the insulating sub-layer at the side of the insulating layer 105 closest to the base substrate 101 being not etched is about 1000-2000 Å.

For example, as illustrated in FIG. 2, in the direction perpendicular to the base substrate 101, a sectional area, a sectional shape and the like of a portion of the first electrode 102 forming the first recess 104 are correlated with a depth and the like of the second recess 106. For example, if a depth of the second recess 106 in the insulating layer 105 is increased, a depth of the portion forming the first recess 104 in the first electrode 102 formed subsequent to the insulating layer 105 would also be increased, an area of the first electrode 102 in per unit area of the base substrate 101 in the direction perpendicular to the base substrate 101 would be correspondingly increased, and a relative area of the first electrode 102 and the second electrode 103 in regions opposite to each other in per unit area of the base substrate 101 would also be correspondingly increased. As a result, a capacitance of a capacitor structure constituted by the first electrode 102 and the second electrode 103 would be improved. Therefore, during the practical manufacturing process, for example, it may control a thickness of the first insulating sub-layer 1051, the second insulating sub-layer 1052 and the third insulating sub-layer 1053 so as to control a depth of the second recess 106, thereby adjusting a magnitude of capacitance of each of the sub-pixels in the array substrate 100, correspondingly.

As illustrated in FIG. 2, the array substrate 100 further includes a dielectric layer 107; the dielectric layer 107 is disposed between the first electrode 102 and the second electrode 103 so that the first electrode 102 and the second electrode 103 are electrically insulated from each other. The capacitor structure 014 includes the first electrode 102, the second electrode 103, and the dielectric layer 107 between the first electrode 102 and the second electrode 103. The dielectric layer 107 includes a portion 108 forming a first recess; the portion of the second electrode 103 forming the first recess 104 is at least partly overlapped with the portion 108 of the dielectric layer 107 forming the first recess in the direction perpendicular to the base substrate 101. In an example, when the second electrode 103 includes a portion forming the first recess 104, the portion of the second electrode 103 forming the first recess 104 is at least partly overlapped with the portion 108 of the dielectric layer 107 forming the first recess in the direction perpendicular to the base substrate 101. For example, a material used for the dielectric layer 107 includes silicon oxide, silicon nitride, silicon oxynitride or any other suitable materials such as a high dielectric coefficient material, without particularly limited in the present embodiment.

As illustrated in FIG. 2, in an example, the array substrate 100 further includes a buffering layer 109, a barrier layer 110, a second insulating layer 111, an interlayered dielectric layer 112, a planarization layer 113 and other structures.

As illustrated in FIG. 2, the buffering layer 109 is disposed on the base substrate 101. The buffering layer 109 for example can prevent impurity ions and moistures or external air and the like from permeating the array substrate 100 through the base substrate 101, and the buffering layer 109 can flatten a surface of the base substrate 101. The buffering layer 109 for example can also prevent impurity ions in the array substrate 101 from diffusing into driving circuit layers formed later, such as the TFT, so as to avoid any influence to the performance of the TFT element such as threshold voltage and leakage current. An example of a material used for the buffering layer 109 includes SiNx, SiOx or any other suitable materials, without particularly limited in the present embodiment. For example, a thickness of the buffering layer 109 is about 6000 Å without limited thereto.

For example, the barrier layer 110 is disposed on the buffering layer 109. The barrier layer 110 of the array substrate 100 for example can avoid an unexpected leakage current which may be caused by photo-induced carriers generated from an external light irradiation on an active layer formed later in the array substrate. An example of a material used for the barrier layer 110 includes a metallic material (e.g., Ag, Cr or the like), SiNx, SiOx or any other suitable materials, without particularly limited in the present embodiment.

For example, the second insulating layer 111 is disposed between the barrier layer 110 and the insulating layer 105. An example of a material of the second insulating layer 111 includes polyimide or any other suitable materials, without particularly limited in the present embodiment. A distance between a bottom of the second recess 106 in the insulating layer 105 and the base substrate 101 is greater than or equal to a distance between an upper surface of the second insulating layer 111 and the base substrate 101. That is, the second recess 106 in the insulating layer 105 would not penetrate the second insulating layer 111, so as to avoid a short circuit to be occurred between the first electrode 102 and the barrier layer 110. For example, the interlayered dielectric layer 112 is disposed on the second electrode 103 and covers the second electrode 103 so as to protect the second electrode 103. For example, the planarization layer 113 is disposed on the interlayered dielectric layer 112. An example of a material used for the interlayered dielectric layer 112 and the planarization layer 113 includes SiNx, SiOx or any other suitable materials, without particularly limited in the present embodiment.

It should be explained that, in order for clarity of illustration, the array substrate 100 is not illustrated in its entire structure. In order to achieve necessary function(s) of the array substrate, other structure(s) not illustrated may be arranged by those skilled in the art according to particular application scenarios, without particularly limited in the present embodiment.

In the array substrate 100 provided by at least one embodiment of the present disclosure, in the direction perpendicular to the base substrate 101, opposite regions of the first electrode 102 and the second electrode 103 include a portion forming the first recess 104. As compared to the array substrate constituted by a flat planar electrode, by designing the first electrode 102 and the second electrode 103 to include a portion constituting the first recess 104, it can increase a relative area of the first electrode 102 and the second electrode 103 in regions opposite to each other, and hence improve a capacitance of a capacitor of the array substrate 100 constituted by the first electrode 102 and the second electrode 103.

Figure 3:
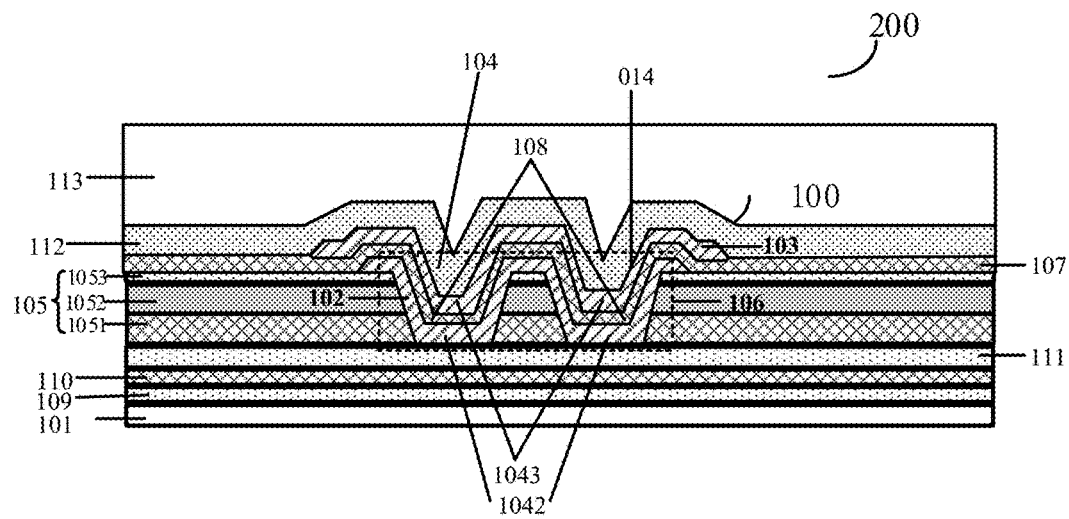
FIG. 3 is a schematic diagram illustrating a sectional structure of an array substrate provided by an embodiment of the present disclosure.

FIG. 3 is a schematic diagram illustrating a sectional structure of an array substrate 200 provided by another embodiment of the present disclosure. As illustrated in FIG. 3, in the array substrate 200, the number of the first recess 104 constituted by the first electrode 102, the second electrode 103 and/or the capacitor structure is two. The structure of the array substrate 200 in this example can be substantially the same with that of the array substrate 100 described in FIG. 2, except the number of the first recess 104 in the first electrode 102 and the second electrode 103. It should be explained that, the number of the first recess 104 in the first electrode 102 and the second electrode 103 of the array substrate 200 may be more than two, instead of being limited to two.

As illustrated in FIG. 3, the first electrode 102, the second electrode 103 and the capacitor structure 014 of the array substrate 200 include two first recesses 104 in regions opposite to each other. For example, the two first recesses 104 are arranged to be closely adjacent to each other. The insulating layer 105 is disposed on the base substrate 105, and is located between the base substrate 101 and the first electrode 102. The insulating layer 105 includes two second recesses 106 formed therein; the two first recesses 104 constituted by the first electrode 102 is at least partly overlapped with the two second recesses 106 in the insulating layer 105, respectively, in the direction perpendicular to the base substrate 101. For example, the capacitor structure 014 is formed on the second recess 106 in a conformal manner. The dielectric layer 107 is disposed between the first electrode 102 and the second electrode 103 so that the first electrode 102 and the second electrode 103 are electrically insulated from each other. The dielectric layer 107 includes portions 108 forming two first recesses; and portions 1043 of the second electrode 103 forming two first recesses 104 are at least partly overlapped with the portions 108 of the dialectic layer 107 forming two first recesses, respectively, in the direction perpendicular to the base substrate 101.

For example, when the design of the product satisfies that the array substrate 200 includes a plurality of first recesses 104, e.g., two first recesses 104, a relative area of the first electrode 102 and the second electrode 103 in regions opposite to each other in per unit area is further increased, so as to further improve the capacitance of the capacitor of the array substrate constituted by the first electrode 102 and the second electrode 103.

Figure 4:
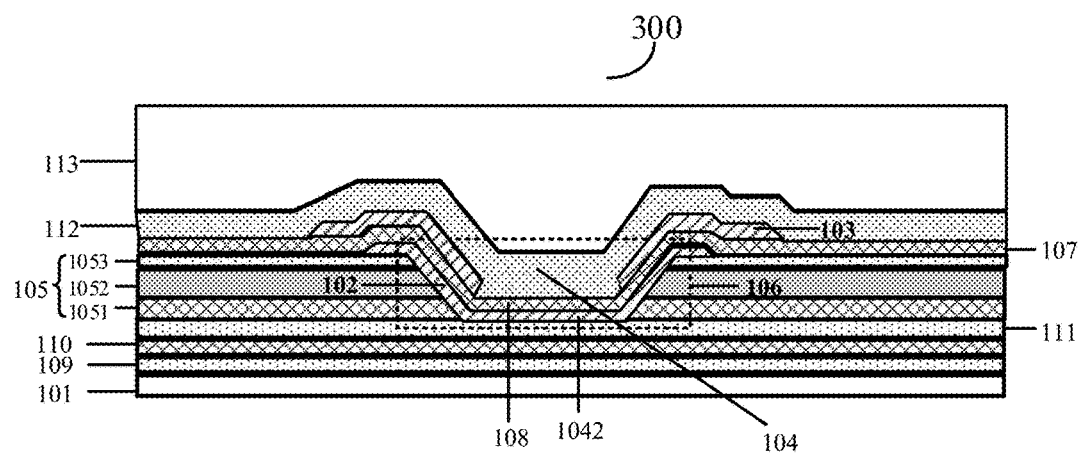
FIG. 4 is a schematic diagram illustrating a sectional structure of an array substrate provided by an embodiment of the present disclosure.

FIG. 4 is a schematic diagram illustrating a sectional structure of an array substrate 300 provided by another embodiment of the present disclosure. Referring to FIG. 4, the array substrate 300 in this example has a structure substantially the same with that of the array substrate 100 described in FIG. 2, except the shape of the second electrode 103. The capacitor structure illustrated in FIG. 4 is located on a side wall of the second recess 106, and a bottom wall of the second recess 106 is not provided with the capacitor structure.

As illustrated in FIG. 4, the first electrode 102 of the array substrate 300 includes a portion forming a first recess 104, the second electrode 103 of the array substrate 300 includes a portion forming a part of a first recess 104, and the portion of the second electrode 103 forming the first recess is at least partly overlapped with the portion of the first electrode 102 forming the first recess 104 in the direction perpendicular to the base substrate 101. The insulating layer 105 is disposed on the base substrate 101 and is located between the base substrate 101 and the first electrode 102. The insulating layer 105 includes a second recess 106 formed therein, and the portion of the first electrode 102 forming the first recess 104 is at least partly overlapped with the second recess 106 in the insulating layer 105 in the direction perpendicular to the base substrate 101. The dielectric layer 107 is disposed between the first electrode 102 and the second electrode 103 so that the first electrode 102 and the second electrode 103 are electrically insulated from each other. The dielectric layer 107 includes a portion 108 forming a first recess 104, and a portion 1043 of the second electrode 103 forming the first recess 104 is at least partly overlapped with the portion 108 of the dielectric layer 107 forming the first recess 104 in the direction perpendicular to the base substrate 101.

In another example, the first electrode 102 includes a portion forming a first recess 104, the second electrode 103 includes a portion forming a first recess 104, and the portion 1043 of the second electrode 103 forming the first recess 104 is at least partly overlapped with the portion 1042 of the first electrode 102 forming the first recess 104 in the direction perpendicular to the base substrate 101. Or, it's also possible that each of the first electrode 102 and the second electrode 103 includes a portion forming a first recess 104 in regions of the first electrode 102 and the second electrode 103 opposite to each other. The shape of the portion of the first electrode 102 and/or the second electrode 103 forming the first recess 104 is not particularly limited in the present embodiment, as long as the shape of the recess can increase a relative area of the first electrode 102 and the second electrode 103 in regions opposite to each other in the direction perpendicular to the base substrate 101.

Figure 5:
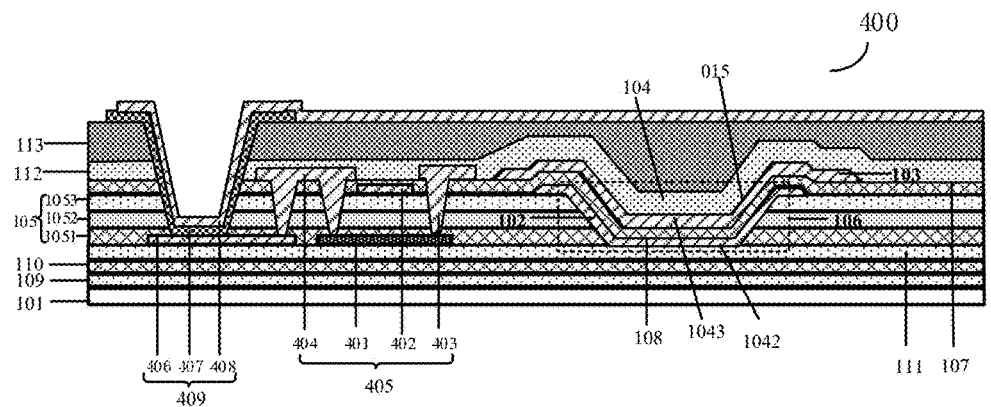
FIG. 5 is a schematic diagram illustrating a sectional structure of an array substrate provided by an embodiment of the present disclosure.

Another embodiment of the present disclosure provides an array substrate 400. FIG. 5 is a schematic diagram illustrating a sectional structure of the array substrate 400 provided by the present embodiment. For example, the array substrate 400 may be used as an array substrate in various, suitable types of display panels.

As illustrated in FIG. 5, the present embodiment will be introduced with reference to the case where the array substrate 400 is an array substrate of an OLED display device, by way of example. The array substrate 400 includes a first electrode 102, a second electrode 103, a driving circuit structure 405, a light-emitting element 409 and other structures. A capacitor structure 014 includes the first electrode 102, the second electrode 103 and a dielectric layer 107. The driving circuit structure 405 for example may be a transistor. The present embodiment will be introduced with reference to the case where the driving circuit structure 405 is a TFT (i.e., a driving transistor), by way of example. The TFT 405 for example may be a top-gate TFT or a bottom-gate TFT, and the type of the TFT 405 is not particularly limited in the present embodiment. The present embodiment will be introduced with reference to the case where the TFT 405 is a top-gate TFT, by way of example. As illustrated in FIG. 5, the TFT 405 includes an active layer 401, a gate electrode 402, a drain electrode 403, a source electrode 404 and other structures. For example, the dielectric layer 107 may be used as a gate insulating layer of the TFT 405 at the same time.

For example, the active layer 401 may include amorphous silicon material, polycrystalline silicon material, metal oxide semiconductor material (e.g., Indium Gallium Zinc Oxide (IGZO)) or any other suitable materials, without particularly limited in the present embodiment. For example, when the array substrate 400 is a low temperature polysilicon (LTPS) TFT array substrate or a high temperature polysilicon (HTPS) TFT array substrate, an amorphous silicon active layer 101 can be crystallized into a polysilicon active layer 101 by using rapid thermal annealing (RTA) method, solid-phase crystallization (SPC) method, excimer laser annealing (ELA) method, metal induced crystallization (MIC) method, metal induced lateral crystallization (MILC) method, sequential lateral solidification (SLS) method or the like.

As illustrated in FIG. 5, the first electrode 102 is disposed in a same layer with the gate electrode 402 of the TFT 405; during the manufacturing process, the first electrode 102 and the gate electrode 402 may be formed simultaneously by using the same patterning process. The second electrode 103 is disposed in the same layer with the source electrode 404 and the drain electrode 403 of the TFT 405; during the manufacturing process, the second electrode 103, the source electrode 404 and the drain electrode 403 may be formed simultaneously by using the same patterning process. Or, in another example, it's also possible that, the first electrode 102 is disposed in the same layer with the active layer 401 of the TFT 405, and the second electrode 103 is disposed in the same layer with the gate electrode 402 or the drain electrode 403/source electrode 404 of the TFT 405. For example, when the TFT 405 is a bottom-gate TFT, the first electrode 102 may be disposed in the same layer with the gate electrode 402 of the TFT 405, and the second electrode 103 may be disposed in the same layer with the active layer 401 or the drain electrode 403/source electrode 404 of the TFT 405.

In an example, the third insulating sub-layer 1053 may also be used as a gate insulating layer of the TFT 405 of the array substrate 400. An example of a material of the third insulating sub-layer 1053 includes SiNx, SiOx or any other suitable materials. For example, when the third insulating sub-layer 1053 is used as the gate insulating layer of the TFT 405, because the gate insulting layer has to be used as a mask to perform an ion doping process to the active layer 401 in the subsequent manufacturing process, a thickness range of the third insulating sub-layer 1053 may be limited to a certain range. For example, the thickness of the third insulating sub-layer 1053 may be smaller than 150 nm. For example, when it needs to increase a depth of the second recess 106 in the insulating layer 105 so as to correspondingly increase a relative area between the first electrode 102 and the second electrode 103, a thickness of the first insulating sub-layer 1051 and the second insulating sub-layer 1052 in the insulating layer 105 can be increased. A change in thickness parameters of the first insulating sub-layer 1051 and the second insulating sub-layer 1052 would not negatively affect the performance of the array substrate 400 constituted by the first insulating sub-layer 1051 and the second insulating sub-layer 1052. For example, a relationship between the depth of the second recess 106 in the insulating layer 105 and the thickness of the first and second insulating sub-layer 1051, 1052 may be obtained through experiments. For example, the thickness of the first insulating sub-layer 1051 is about 6000 Å. For example, the thickness of the second insulating sub-layer 1052 is about 4000 Å.

As illustrated in FIG. 5, the light-emitting layer 409 is an organic light-emitting diode (OLED); the light-emitting layer 409 for example includes a pixel electrode 406, an opposite electrode 408, and an organic functional layer 407 between the pixel electrode 406 and the opposite electrode 408. The pixel electrode 406 is electrically connected with the source electrode 404 of the TFT 405; of course, the pixel electrode 406 may also be electrically connected with the drain electrode 403 of the TFT 405, so that the TFT 405 of each of the sub-pixel units in the array substrate 400 can be configured to apply a signal to the pixel electrode 406. A material of the pixel electrode 406 includes a transparent conductive material, which, for example, may be Indium Tin Oxide (ITO), Indium Zinc Oxide (IZO) or any other suitable materials. The opposite electrode 408 may be configured as a common electrode of the array substrate 400. For example, the pixel electrode 406 may be used as an anode of the light-emitting element 409, and the opposite electrode 408 may be used as a cathode of the light-emitting element 409. Of course, it's also possible that the pixel electrode 406 is used as the cathode of the light-emitting element 409, and the opposite electrode 408 is used as the anode of the light-emitting element 409.

The organic functional layer 407 for example includes an organic light-emitting layer, and may further include one or more of a hole transport layer, a hole injection layer, an electron transport layer and an electron injection layer, depending on demands.

It should be explained that, in order for clarity of illustration, the array substrate 400 is not illustrated in its entire structure. In order to achieve necessary function(s) of the array substrate, other structure(s) not illustrated may be arranged by those skilled in the art according to particular application scenarios, without particularly limited in the present embodiment.

The array substrate 400 provided by at least one embodiment of the present disclosure includes structures such as the first electrode 102, the second electrode 103, the TFT 405 and the light-emitting element 409. As compared to the array substrate constituted by a flat planar electrode, by providing the first electrode 102 and the second electrode 103 with a bending design, each of the first electrode 102 and the second electrode 103 can include a portion forming a first recess 104, which increases a relative area of the first electrode 102 and the second electrode 103 in regions opposite to each other in per unit area, and improves a capacitance of the array substrate 400 constituted by the first electrode 102 and the second electrode 103, so as to facilitate the design of the array substrate 400 in terms of high resolution ratio and improve the display quality.

Other technical effect(s) achieved by the array substrate 400 provided in the present embodiment may be referred to that of any array substrate described in the embodiments above, without repeating herein.

For example, another embodiment of the present disclosure further provides a display panel including any array substrate described in the embodiments above. The display panel may be, for example, a liquid crystal display panel or an organic light-emitting diode display panel and the like. The technical effect achieved by the display panel may be referred to that of the array substrate described in the embodiments above, without repeating herein.

For example, another embodiment of the present disclosure further provides an electronic device including any array substrate described in the embodiments above. The electronic device for example may be any product or component including the array substrate, such as a display, a television, a digital camera, a mobile phone, a watch, a tablet computer, a notebook computer and a navigation device. The technical effect(s) achieved by the electronic device may be referred to that of the array substrate described in the embodiments above, without repeating herein.

Another embodiment of the present disclosure provides a manufacturing method of an array substrate, including: forming an insulating layer on a base substrate; forming a recess in the insulating layer, the recess penetrating at least part of the insulating layer from a side of the insulating layer facing away from the base substrate; and forming a capacitor structure at least on a side wall of the recess in a conformal manner. Forming the capacitor structure includes: forming a first electrode, forming a second electrode, and forming a dielectric layer located between the first electrode and the second electrode.

Another embodiment of the present disclosure provides a manufacturing method of an array substrate, and the array substrate is any array substrate described in the embodiments above. The present embodiment will be described with reference to the manufacturing method of the array substrate 200 by way of example. FIGS. 6A-6G are schematic diagrams illustrating a sectional structure of the array substrate 200 during the manufacturing method as provided by the present embodiment.

Figure 6A:
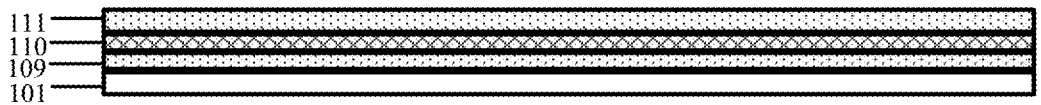
FIGS. 6A-6G are schematic diagrams illustrating a sectional structure of an array substrate provided by an embodiment of the present disclosure during a manufacturing method.

As illustrated in FIG. 6A, first of all, the method includes providing a base substrate 101, the base substrate 101 for example may be a glass substrate, a quartz substrate, a plastic substrate or a substrate of any other suitable materials, without particularly limited in the present embodiment. For example, the base substrate 101 may also be a flexible substrate of polyimide. When a flexible substrate is adopted, it may be placed on a bearing glass so as to facilitate fabrication of film layers.

As illustrated in FIG. 6A, the method includes depositing a buffering layer 109 on the base substrate 101 by using, for example, chemical vapor deposition (CVD) method, physical vapor deposition (PVD) method or the like. The buffering layer 109 for example can prevent impurity ions and moistures or external air and the like from permeating the array substrate through the base substrate 101; at the same time, and the buffering layer 109 for example can flatten a surface of the base substrate 101. The buffering layer 109 for example can also prevent impurity ions in the array substrate 101 from diffusing into circuit layer(s) formed later, including TFT and the like, so as to avoid any influence to the performance of the TFT element, such as threshold voltage and leakage current. An example of a material used for the buffering layer 109 includes SiNx, SiOx or any other suitable materials, without particularly limited in the present embodiment.

As illustrated in FIG. 6A, the method includes depositing a barrier layer 110 on the buffering layer 109 by using, for example, CVD method, PVD method or the like. For example, the barrier layer 110 may be configured to avoid an unexpected leakage current which may be caused by photo-induced carriers generated from an external light irradiation on an active layer formed later in the array substrate. An example of a material used for the barrier layer 110 includes a metallic material (e.g., Ag, Cr or the like), SiNx, SiOx or any other suitable materials, without particularly limited in the present embodiment.

As illustrated in FIG. 6A, the method includes depositing a second insulating layer 111 on the barrier layer 110 by using, for example, CVD method, PVD method or the like. An example of a material of the second insulating layer 111 includes polyimide or any other suitable materials, without particularly limited in the present embodiment.

Figure 6B:
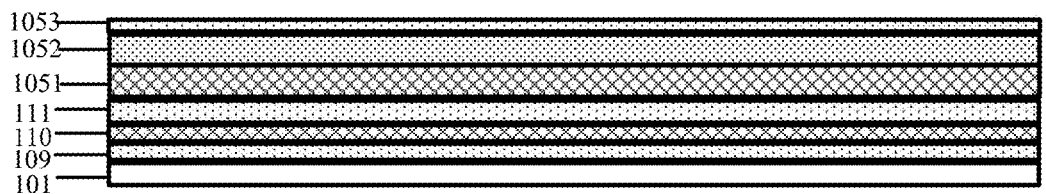

As illustrated in FIG. 6B, the method includes depositing a first insulating sub-layer 1051, a second insulating sub-layer 1052, and a third insulating sub-layer 1053, in sequence, on the second insulating layer 111 by using, for example, CVD method, PVD method or the like, so as to constitute an insulating layer 105. For example, according to the requirements of product design, the first insulating sub-layer 1051, the second insulating sub-layer 1052, and the third insulating sub-layer 1053 having a required thickness may be obtained, respectively, by controlling parameters such as deposition time and deposition rate. Of course, the number of insulating sub-layer included in the insulating layer 105 includes but is not limited to three. For example, according to the requirements of product design, the number of insulating sub-layer included in the insulating layer 105 may be one, two, four or more, without particularly limited in the present embodiment. An example of a material used for the first insulating sub-layer 1051, the second insulating sub-layer 1052, and the third insulating sub-layer 1053 includes SiNx, SiOx or any other suitable materials, without particularly limited in the present embodiment.

Figure 6C:
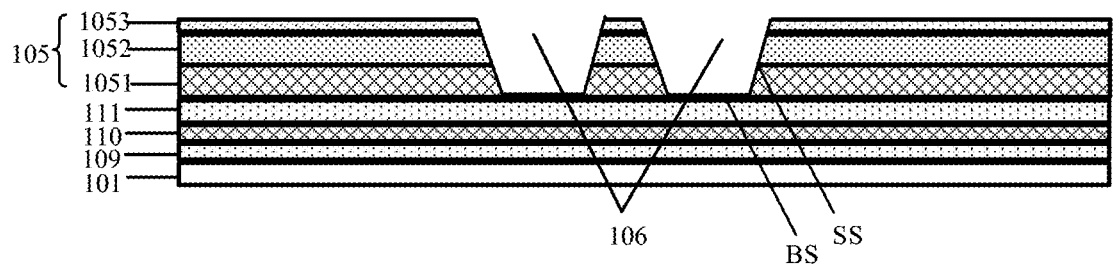

As illustrated in FIG. 6C, the method includes forming a photoresist layer (not illustrated) on the entire surface of the third insulating sub-layer 1053, and patterning the photoresist layer by using a patterning process including steps of exposing and developing so as to form a photoresist pattern with a required shape on the third insulating sub-layer 1053; and then simultaneously etching the third insulating sub-layer 1053, the second insulating sub-layer 1052 and the first insulating sub-layer 1051 by using the photoresist pattern as an etching mask, so as to form two second recesses 106 in the insulating layer 105 constituted by the third insulating sub-layer 1053, the second insulating sub-layer 1052 and the first insulating sub-layer 1051. For example, the two second recesses 106 are formed in parallel. The etching method includes, for example, dry etching. By controlling parameters such as etching time and etching rate, a depth of the second recess 106 can be controlled, so that the second recess 106 as formed at least can penetrate at least one insulating sub-layer at a side of the insulating layer 105 far away from the base substrate 101 and would not penetrate the second insulating layer 111. As illustrated in FIG. 6C, the second recess 106 includes a bottom wall BS and a side wall SS.

Figure 6D:
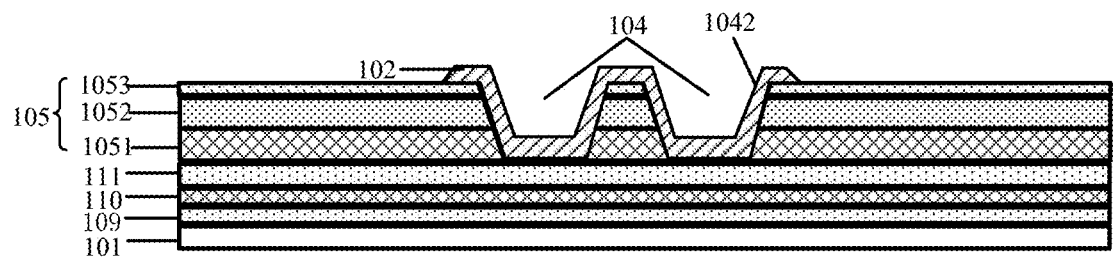

As illustrated in FIG. 6D, the method includes depositing a metallic layer on the third insulating sub-layer 1053 by using, for example, CVD method, PVD method or the like, and then patterning the metallic layer by using photolithographic technology so as to form a first electrode 102 including two first recesses 104 on the third insulating sub-layer 1053. Portions 1042 of the first electrode 102 including two first recesses 104 are formed along the two second recesses 106 of the insulating layer 105, respectively, in a conformal manner. An example of a material used for the first electrode 102 includes Ag, Al, Cr, Cu, Mo, Ti, Al—Nd alloy, Cu—Mo alloy, Mo—Ta alloy, Mo—Nd alloy or any combination thereof. For example, as illustrated in FIG. 6D, the first electrode has a portion in a shape as same as that of the second recess 106.

For example, in another example, the method includes depositing a metallic layer on the third insulating sub-layer 1053 by using CVD method, PVD method or the like, and then patterning the metallic layer by using photolithographic technology so as to form a first electrode 102 on the third insulating sub-layer 1053. The first electrode 102 includes a portion forming a first recess 104, and the portion 1042 of the first electrode 102 forming the first recess 104 is formed along at least one second recess 106 in a conformal manner.

Figure 6E:
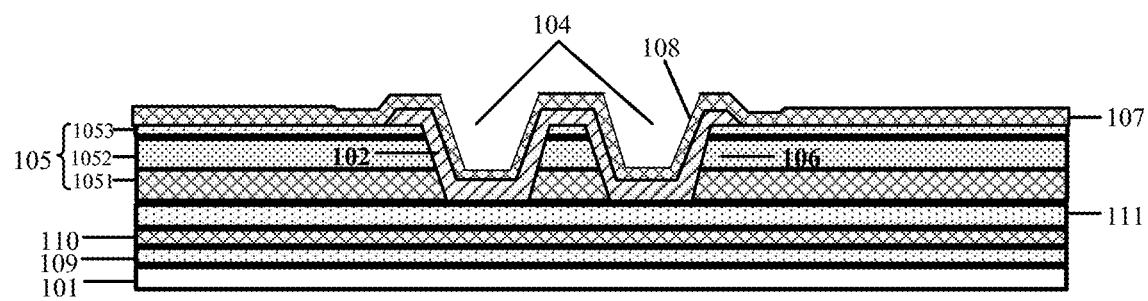

As illustrated in FIG. 6E, after forming the first electrode 102 having portions forming two first recesses 104 on the third insulating sub-layer 1053, the method includes depositing a dielectric layer film on the first electrode 102 by using, for example, CVD method, PVD method or the like, and then patterning the dielectric layer film by using photolithographic technology so as to form a dielectric layer 107 on the second electrode 103. The dielectric layer 107 as formed includes portions 108 forming two first recesses 104, and the portions 108 forming two first recesses 104 are formed along portions 1042 of the first electrode 102 forming two first recesses 104, respectively, in a conformal manner. An example of a material used for the dielectric layer 107 includes silicon oxide, silicon nitride, silicon oxynitride or any other suitable materials such as a high dielectric coefficient material, without particularly limited in the present embodiment. For example, as illustrated in FIG. 6E, the dielectric layer 107 has a portion in a shape as same as that of the second recess.

Figure 6F:
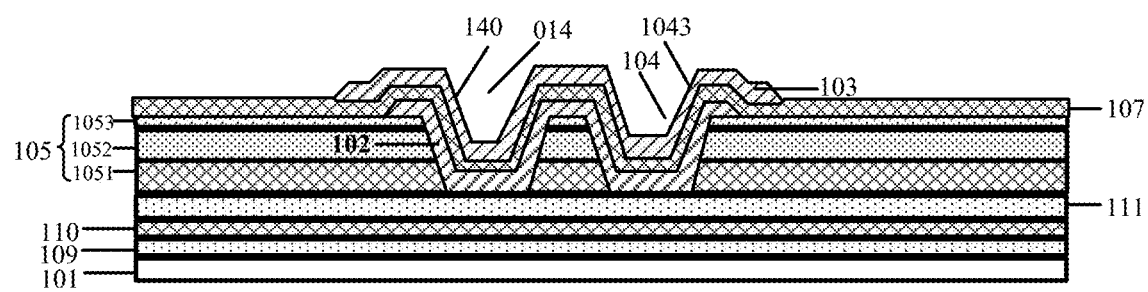
Figure 6G:
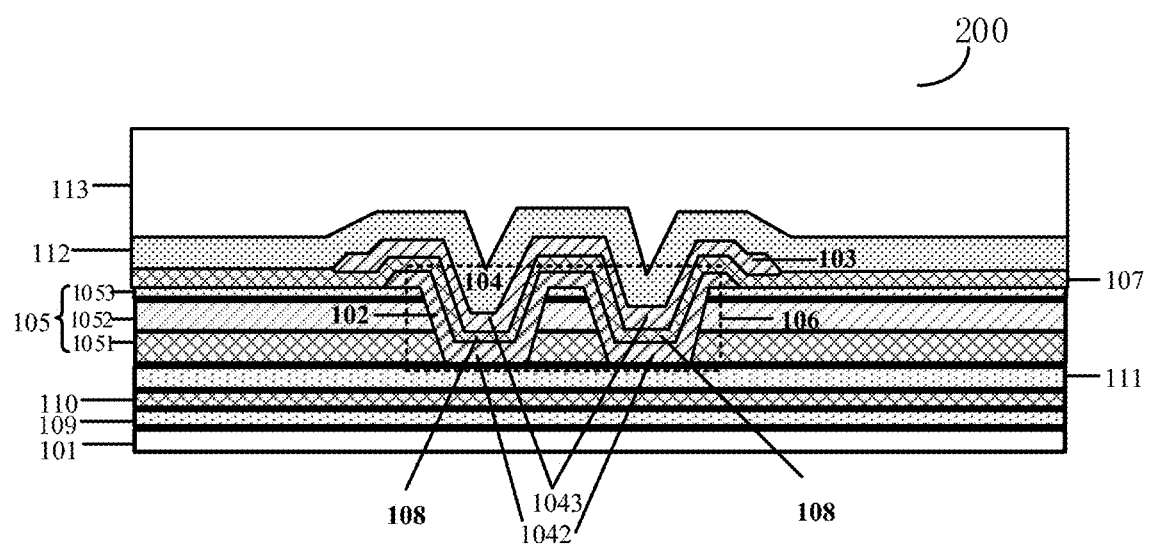

As illustrated in FIG. 6F, the method includes depositing a metallic layer on the dielectric layer 107 by using CVD method, PVD method or the like, and then patterning the metallic layer by using photolithographic technology so as to form a second electrode 103 on the dielectric layer 107. The second electrode 103 as formed is at least partly opposite to the first electrode 102 in the direction perpendicular to the base substrate 101, and the second electrode 103 and the first electrode 102 are electrically insulted from each other through the dielectric layer 107. The second electrode 103 includes portions 1043 forming two first recesses 104; and the portions 1043 of the second electrode 103 forming two first recesses 104 are formed along the portions 108 of the dielectric layer 107 forming two first recesses 104, respectively, in a conformal manner. An example of a material used for the second electrode 103 includes Ag, Al, Cr, Cu, Mo, Ti, Al—Nd alloy, Cu—Mo alloy, Mo—Ta alloy, Mo—Nd alloy or any combination thereof. As illustrated in FIG. 6F, the capacitor structure 014 has a portion 140 forming a first recess 104.

In another example, the method includes depositing a metallic layer on the dielectric layer 107 by using CVD method, PVD method or the like, and then patterning the metallic layer by using patterning process so as to form a second electrode 103 on the dielectric layer 107. The second electrode 103 includes a portion forming a first recess 104; and the portion 1043 of the second electrode 103 forming the first recess 104 and the portion 108 of the dielectric layer 107 forming at least one first recess are formed in a conformal manner.

As illustrated in FIG. 6Q after forming the second electrode 103 including portions 1043 forming two first recesses 104, the method includes depositing an interlayered dielectric film 112 on the second electrode 103 by using CVD method, PVD method or the like, and then patterning the interlayered dielectric film by using photolithographic technology so as to form an interlayered dielectric layer 112. The interlayered dielectric layer 112 covers the second electrode 103 so as to protect the second electrode 103; an example of a material used for the interlayered dielectric layer 112 includes SiNx, SiOx or any other suitable materials, without particularly limited in the present embodiment.

The method further includes depositing a planarization layer film on the interlayered dielectric layer 112, and then patterning the planarization layer film by using a patterning process so as to form a planarization layer 113. An example of a material used for the planarization layer 113 includes SiNx, SiOx or any other suitable materials, without particularly limited in the present embodiment.

In the manufacturing method of the array substrate 200 provided by at least one embodiment of the present disclosure, as compared to the array substrate constituted by a flat planar electrode, in the direction perpendicular to the base substrate 101, by designing the first electrode 102 and the second electrode 103 to each include portions forming two first recesses 104, a relative area of the first electrode 102 and the second electrode 103 in regions opposite to each other can be increased, and the capacitance of the array substrate 200 constituted by the first electrode 102 and the second electrode 103 can be improved.

In case of no conflict, the embodiments and the features in the embodiments can be combined with each other to attain additional embodiment(s).

The above are only specific implementations of the present disclosure, without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An array substrate, comprising:
    a base substrate;
    a first electrode on the base substrate; and
    a second electrode at a side of the first electrode facing away from the base substrate, the second electrode being at least partly opposite to the first electrode in a direction perpendicular to the base substrate, wherein
    the first electrode and the second electrode are electrically insulated from each other, and a capacitor structure is constituted by a region of the first electrode and a region of the second electrode which are opposite to each other,
    the capacitor structure comprises a portion forming a part of a first recess,
    wherein the first recess comprises a bottom surface and a side wall, and the second electrode comprises two portions that are separated from each other, and a gap is provided between the two portions of the second electrode, and an orthographic projection of the gap on the base substrate overlaps with an orthographic projection of the bottom surface on the base substrate.

2. The array substrate according to claim 1, wherein the capacitor structure comprises a portion forming a plurality of first recesses.

3. The array substrate according to claim 1, further comprising an insulating layer, wherein
    the insulating layer is located between the base substrate and the first electrode and comprises a second recess formed in the insulating layer, at least a portion of the capacitor structure is at least located on a side wall of the second recess, and is not located on a bottom surface of the second recess.

4. The array substrate according to claim 3, wherein the portion of the capacitor structure forming the part of the first recess is at least partly overlapped with the second recess in the insulating layer, in the direction perpendicular to the base substrate.

5. The array substrate according to claim 3, wherein the insulating layer has a stacked structure and comprises at least two insulating sub-layers which are stacked sequentially from the base substrate,
    the second recess penetrates at least one insulating sub-layer at a side of the insulating layer far away from the base substrate.

6. The array substrate according to claim 5, wherein at least part of an insulating sub-layer at a side of the insulating layer closest to the base substrate is not penetrated by the second recess.

7. The array substrate according to claim 3, wherein the second recess comprises a plurality of second sub-recesses, the first recess comprises a portion forming a plurality of first sub-recesses, the plurality of first sub-recesses and the plurality of second sub-recesses are in one-to-one correspondence, and each of the plurality of first sub-recesses is located inside one of the plurality of second sub-recesses.

8. The array substrate according to claim 1, wherein the capacitor structure further comprises a dielectric layer located between the first electrode and the second electrode, so that the first electrode and the second electrode are electrically insulated from each other.

9. The array substrate according to claim 1, further comprising a thin film transistor (TFT), wherein
    the TFT comprises an active layer, a gate electrode and a drain electrode;
    the first electrode is located in a same layer with one of the active layer, the gate electrode and the drain electrode; and
    the second electrode is located in a same layer with one of the active layer, the gate electrode and the drain electrode.

10. The array substrate according to claim 1, further comprising a TFT and a light-emitting element, wherein
    the TFT comprises a drain electrode, the light-emitting element comprises a pixel electrode, and the pixel electrode is electrically connected with the drain electrode.

11. A display panel, comprising the array substrate according to claim 1.

12. An electronic device, comprising the array substrate according to claim 1.

13. The array substrate according to claim 1, wherein an interlayered dielectric layer is located on the second electrode, and the gap is filled with an insulating material of the interlayered dielectric layer.

14. A manufacturing method of an array substrate, comprising:
    providing a base substrate;
    forming a first electrode on the base substrate;
    forming a second electrode on the first electrode, the second electrode being at least partly opposite to the first electrode in a direction perpendicular to the base substrate, wherein
    the first electrode and the second electrode are electrically insulated from each other, and a capacitor structure is constituted by a region of the first electrode and a region of the second electrode which are opposite to each other, and
    the capacitor structure comprises a portion forming part of a first recess,
    wherein the first recess comprises a bottom surface and a side wall, and the second electrode comprises two portions that are separated from each other, and a gap is provided between the two portions of the second electrode, and an orthographic projection of the gap on the base substrate overlaps with an orthographic projection of the bottom surface on the base substrate.

15. The manufacturing method according to claim 14, wherein the capacitor structure comprises a portion forming a plurality of first recesses.

16. The manufacturing method according to claim 14, further comprising:
    before forming the first electrode, forming an insulating layer film on the base substrate and etching the insulating layer film to form an insulating layer comprising a second recess, wherein the portion of the capacitor structure forming part of the first recess is at least partly overlapped with the second recess in the direction perpendicular to the base substrate.

17. The manufacturing method according to claim 16, wherein the capacitor structure is formed on a side wall of the second recess, and is not located on a bottom surface of the second recess.

18. The manufacturing method according to claim 14, further comprising:

forming a gate electrode of a thin film transistor (TFT) in a first patterning process of forming the first electrode; and forming a source electrode and a drain electrode of the TFT in a second patterning process of forming the second electrode.

19. The manufacturing method according to claim 14, further comprising forming an interlayered dielectric layer on the second electrode, and the gap is filled with an insulating material of the interlayered dielectric layer.

20. An array substrate, comprising:

a base substrate;

an insulating layer located on the base substrate, the insulating layer comprising a recess, the recess penetrating at least part of the insulating layer from a side of the insulating layer facing away from the base substrate; and a capacitor structure at least located on a side wall of the recess, the capacitor structure comprising a first electrode, a second electrode and a dielectric layer located between the first electrode and the second electrode, wherein the recess comprises a bottom surface, the second electrode comprises two portions that are separated from each other, and a gap is provided between the two portions of the second electrode, and an orthographic projection of the gap on the base substrate overlaps with an orthographic projection of the bottom surface on the base substrate.

* * * * *